(12) United States Patent
Takase (10) Patent No.: US 8,008,940 B2
(45) Date of Patent: Aug. 30, 2011

(54) CIRCUIT BOARD TEST SYSTEM AND TEST METHOD

(75) Inventor: Nobuyuki Takase, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 171 days.

(21) Appl. No.: 12/379,359

(22) Filed: Feb. 19, 2009

(65) Prior Publication Data

US 2009/0267628 A1    Oct. 29, 2009

(30) Foreign Application Priority Data

Feb. 26, 2008 (JP) .................. 2008-044381

(51) Int. Cl.
*G01R 31/26* (2006.01)
(52) U.S. Cl. .................. 324/762.01
(58) Field of Classification Search .......... 324/763, 324/765, 754, 761, 762, 758, 762.01–762.09, 324/750.3; 257/48
See application file for complete search history.

(56) References Cited

U.S. PATENT DOCUMENTS 5,825,171 A * 10/1998 Shin ......................... 324/73.1
6,118,286 A * 9/2000 Fredrickson ............ 324/756.02
6,137,709 A * 10/2000 Boaz et al. .................. 365/51

FOREIGN PATENT DOCUMENTS

JP       4-159752   6/1992
JP       6-28766    4/1994

* cited by examiner

*Primary Examiner* — Vinh P Nguyen
*Assistant Examiner* — Tung X. Nguyen
(74) *Attorney, Agent, or Firm* — McGinn IP Law Group, PLLC (57) ABSTRACT

A circuit board system is adapted to check a DUT (Device Under Test) and a communication device on a DUT board, check the connection between DUT and communication device and check connections of parts mounted on DUT board. The system, which tests a circuit board used when a DUT is tested using a tester, has a socket into which DUT is removably inserted; a communication device mounted thereon; first wires electrically connecting first signal terminals of DUT and the tester; and second wires electrically connecting second signal terminals of DUT, which are not electrically connected to the first signal terminals, and signal terminals of the communication device. A shorting board is inserted into the socket in place of DUT when the circuit board is tested, the shorting board having short-circuit wires electrically connecting the first wires and the second wires.

12 Claims, 7 Drawing Sheets

DPS1=0V、DPS2=1V
Pa=0V, Pb=0V, Pc=0V
→ SHORTING BOARD -1

FIG.3B

DPS1=0V、DPS2=1V
Pa=0V, Pb=0V, Pc=1V
→ SHORTING BOARD -2

FIG.3C

DPS1=0V、DPS2=1V
Pa=0V, Pb=1V, Pc=1V
→ SHORTING BOARD -3

FIG.6 (COMPARATIVE EXAMPLE 1)

FIG.7 (COMPARATIVE EXAMPLE 2)

CIRCUIT BOARD TEST SYSTEM AND TEST METHOD

RELATED APPLICATION

This invention is claiming the priority of JP Patent Application No. 2008-044381 filed on Feb. 26, 2008, the entire disclosure thereof being incorporated herein by reference thereto.

FIELD OF THE INVENTION

This invention relates to a circuit board test system and method for testing a circuit board used when a device under test is tested using a tester.

BACKGROUND

The trend toward higher functionality, larger scale and faster speed in LSI (Large-Scale Integration) has been accompanied by greater difficulty in terms of verifying all of the functions of an LSI chip using just the functions of an LSI tester. Moreover, LSI testers are high in cost. Rather than enhancing the functionality of an LSI tester, therefore, it has been contemplated to lower testing cost by using a DUT (Device Under Test) board that makes it possible to insert a DUT between an LSI tester and a DUT such as an LSI chip. With regard to a DUT board of this kind, there are increasing instances where various communication devices such as a CPU (Central Processing Unit) and memory are mounted on the DUT board that electrically connects the LSI tester and the DUT, and the functions of the DUT are checked by causing the communication devices and DUT to communicate. Against this background, there are cases where the configuration of the DUT board is much more complicated than in the past. It should be noted that with an ordinary DUT board, the signal terminals of the DUT and the signal terminals of the LSI tester are just connected through wiring, and whether the connections are correct or not is determined using the measurement function of the LSI tester.

[Patent Document 1] Japanese Utility Model Kokai Publication JP-U-6-28766A

[Patent Document 2] Japanese Patent Kokai Publication No. JP-H04-159752A

SUMMARY OF THE DISCLOSURE

The following analysis on the background art is given by the present invention. The disclosures of the above Patent Documents are incorporated herein by reference thereto.

However, in the case of a complicated DUT board on which various communication devices have been mounted, whether the communication devices have the desired functions and whether wiring connections between the DUT and communication devices are correct is difficult to verify because the signal terminals of the communication devices are not connected to the signal terminals of the LSI tester.

Further, the fact that a circuit using the functions of the LSI tester for checking whether the functions of communication devices are correct and whether two devices are interconnected is inserted into the wiring between the DUT and communication devices invites further complication of the DUT board and an increase in cost. Furthermore, in a case where the communication between a DUT and a communication device is performed at high speed, degradation of the signal waveform between the DUT and the communication device is brought about by this circuit. In practical terms, therefore, it is almost impossible to achieve the desired goals.

Further, there are also instances where a DUT board especially for a communication device is necessary in order to verify whether the communication device per se has the desired functions. This also is a factor in raising cost.

A probe for testing a burn-in board having a plurality of IC insertion sockets is disclosed in Patent Document 1 as prior art relating to a DUT board and method of testing same. The probe has a package similar to a package for mounting a test IC inserted into a socket, and prescribed terminals of the package are connected together conductively. By inserting the probe into the IC insertion socket, the internal wiring of the burn-in board and the mounted parts are checked.

Patent Document 2 discloses a technique for readily testing the connections between a printed circuit board and external terminals of a semiconductor integrated circuit device. The semiconductor integrated circuit device is provided with a switching circuit for deciding whether to connect, via an internal circuit, an input terminal and an output terminal that are connected to external terminals of the semiconductor integrated circuit device, or to interrupt the connection. By mounting such a semiconductor integrated circuit device on a printed circuit board, connections are checked by measuring the resistance-measurement level merely between the input and output terminals using a simple conduction tester.

With the techniques described in Patent Documents 1 and 2, however, a DUT or communication device cannot be checked and neither can the connection between a DUT and a communication device. The connections of a part (terminating resistor or power-source filter) mounted on the board cannot be checked and parameters cannot be measured. Thus, there is much to be desired in the art.

The present invention mainly seeks to check a DUT and a communication device on a DUT board, check the connection between the DUT and the communication device, check the connections of parts mounted on the DUT board, and measure parameters.

According to a first aspect of the present invention, there is provided a circuit board test system for testing a circuit board used in a case where a device under test is tested using a tester. The circuit board comprises: a socket into which a device under test is removably inserted; one or a plurality of communication devices mounted thereon directly or indirectly; a plurality of first wires electrically connecting first signal terminals of the device under test and the tester; and a plurality of second wires electrically connecting second signal terminals of the device under test, which are not electrically connected to the first signal terminals, and signal terminals of the communication device. A shorting board is inserted into the socket in place of the device under test when the circuit board is tested, the shorting board having short-circuit wires electrically connecting the first wires and the second wires.

According to a second aspect of the present invention, there is provided a circuit board test method of testing a circuit board used in a case where a device under test is tested using a tester. The method comprises: recognizing type of a shorting board, which has been inserted into the circuit board, using the tester; and checking electrical connection between the circuit board and a communication device mounted on the circuit board, or function of the communication device, using the tester in accordance with the type of shorting board recognized.

According to a third aspect of the present invention, there is provided a program executed by a tester, wherein (each of the steps of) the above-described method of testing a circuit board are caused to be executed by a tester.

Meritorious effects are achieved in various aspects as set forth below.

In accordance with the present invention, the logical operation of various parts mounted on a circuit board can be checked, the connections can be verified and parameters can be checked at high speed using the measurement function of a tester. Further, in accordance with the present invention, a verifying circuit or a tester signal terminal need not be added to wiring to undergo inspection on a circuit board, no signal degradation at the time of a test operation is induced, characteristics are not adversely affected and there is no overhead in terms of the area of the circuit board. Furthermore, in accordance with the present invention, the fact that a shorting board has been inserted and the type of inserted shorting board can be specified by a tester-executed program. As a result, it is possible to check a circuit board without re-loading the tester software even in a mass-production environment. This means that there is no decline in the throughput of mass production.

Other features and advantages of the present invention will be apparent from the following description taken in conjunction with the accompanying drawings, in which like reference characters designate the same or similar parts throughout the figures thereof.

PREFERRED MODES

Figure 1:
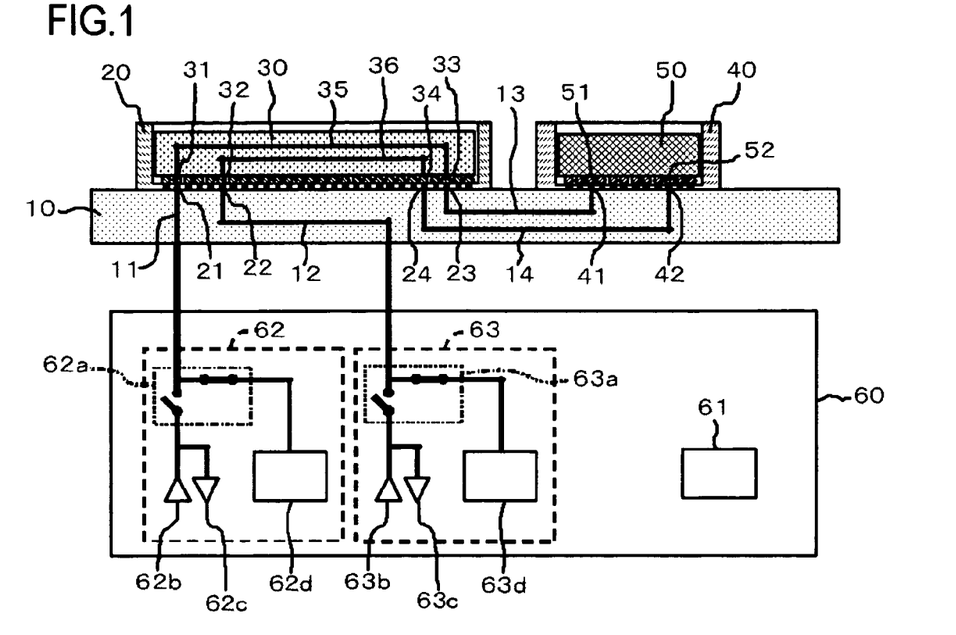
FIG. 1 is a schematic view illustrating the configuration of a circuit board test system according to a first exemplary embodiment of the present invention.

In one preferred mode, there is provided a circuit board test system for testing a circuit board 10 (see FIG. 1) used in a case where a device under test is tested using a tester 60 (FIG. 1). The circuit board 10 (FIG. 1) has a socket 20 (FIG. 1) into which the device under test is removably inserted, has one or a plurality of communication devices 50 (FIG. 1) mounted thereon directly or indirectly, has a plurality of first wires 11, 12 (FIG. 1) electrically connecting first signal terminals of the device under test and the tester 60 (FIG. 1), and has a plurality of second wires 13, 14 (FIG. 1) electrically connecting second signal terminals of the device under test, which are not electrically connected to the first signal terminals, and signal terminals 51, 52 (FIG. 1) of the communication device 50 (FIG. 1), and a shorting board 30 (FIG. 1) is inserted into the socket 20 (FIG. 1) instead of the device under test when the circuit board 10 (FIG. 1) is tested, the shorting board 30 (FIG. 1) having short-circuit wires 33, 34 (FIG. 1) electrically connecting the first wires 11, 12 (FIG. 1) and the second wires 13, 14 (FIG. 1).

In one preferred mode, the present invention provides a circuit board test method of testing a circuit board used when a device under test is tested using a tester, the method comprising: a step A2 (see FIG. 2): recognizing the type of a shorting board, which has been inserted into the circuit board, using the tester; and a step A3 (FIG. 2): checking electrical connection between the circuit board and a communication device mounted on the circuit board, or function of the communication device, using the tester in accordance with the type of shorting board recognized.

First Exemplary Embodiment

A circuit board test system according to a first exemplary embodiment of the present invention will now be described. FIG. 1 is a schematic view illustrating the configuration of a circuit board test system according to the first exemplary embodiment.

The circuit board test system is a system for a DUT board 10 serving as a circuit board. The circuit board 10, on which a shorting board 30 [or DUT (Device Under Test)] and a communication device 50 have been mounted, is electrically connected to an LSI tester 60.

The DUT board 10 is a circuit board on which the shorting board 30 (or DUT) and communication device 50 are mounted when a test is conducted. Mounted on the DUT board 10 are a socket 20 for removable insertion of the shorting board 30 (or DUT), and a socket 40 for removable insertion of the communication device 50. The DUT board 10 has wires 11, 12 electrically connecting terminals 21, 22, respectively, of socket 20 to the LSI tester 60, and wires 13, 14 electrically connecting terminals 23, 24 of socket 20 and terminals 41, 42 of socket 40, respectively. A circuit board on which various electronic parts have been mounted, such as a board for a BOST (Built-Out Self-Test), can be used as the DUT board 10.

The wires 11, 12 are wiring traces used in order that the DUT (or shorting board 30) and LSI tester 60 may communicate at the time of a test. The wires 11, 12 are formed inside the DUT board 10 and are electrically connected to the LSI tester 60 via external wiring between the DUT board 10 and the LSI tester 60.

The wires 13, 14 are wiring traces used in order that the DUT (or shorting board 30) and communication device 50 may communicate at the time of a test. The wires 13, 14 electrically connect the terminals 23, 24 of socket 20 and the terminals 41, 42 of socket 40, respectively. The wires 13, 14 are formed inside the DUT board 10.

The socket 20 is for removable insertion of the shorting board 30 (or DUT). The socket 20 is mounted on the DUT board 10 and has terminals 21, 22, 23, 24 at positions corresponding to signal terminals 31, 32, 33, 34, respectively, of the shorting board 30 (or DUT). The terminal 21 is in contact with the signal terminal 31 of the shorting board 30 (or DUT) and is electrically connected to the LSI tester 60 via the wire 11 and external wiring. The terminal 22 is in contact with the signal terminal 32 of the shorting board 30 (or DUT) and is electrically connected to the LSI tester 60 via the wire 12 and external wiring. The terminal 23 is in contact with the signal terminal 33 of the shorting board 30 (or DUT) and is electrically connected to the terminal 41 of socket 40 via the wire 13. The terminal 24 is in contact with the signal terminal 34 of the shorting board 30 (or DUT) and is electrically connected to the terminal 42 of socket 40 via the wire 14.

The shorting board 30 is a board wired so as to short-circuit the terminals 21, 22 of socket 20 and the corresponding terminals 23, 24, respectively, of socket 20, and is used in place of a DUT (not shown). The shorting board 30 is formed to have a size similar to that of the DUT (not shown), such as an LSI chip, and is removably inserted into the socket 20. The terminals 31, 32, 33, 34, which are ball-shaped, are attached to the shorting board 30 on the surface thereof that opposes the terminals 21, 22, 23, 24 of socket 20. The shorting board 30 short-circuits and electrically connects the wires 11 and 13 by the signal terminal 31, a shorting wire 35 and the signal terminal 33, and short-circuits and electrically connects the wires 12 and 14 by the signal terminal 32, a shorting wire 36 and the signal terminal 34.

The socket 40 is for removable insertion of the communication device 50. The socket 40 is mounted on the DUT board 10 and has the terminals 41, 42 at positions corresponding to the signal terminals 51, 52, respectively, of the communication device 50. The terminal 41 is electrically connected to the terminal 23 of socket 20 via the wire 13. The terminal 42 is electrically connected to the terminal 24 of socket 20 via the wire 14.

The communication device 50 is a device having a communication function, such as a CPU or memory. The communication device 50 is removably inserted into the socket 40. The terminals 51, 52, which are ball-shaped, are attached to the communication device 50 on the surface thereof that opposes the terminals 41, 42, respectively, of socket 40.

The LSI tester 60 is an apparatus for testing the DUT, communication device 50 and DUT board 10. The LSI tester 60 is electrically connected to the DUT board 10 by external wiring. The LSI tester 60 has a device power-source unit 61 and signal terminal testing units 62, 63.

The device power-source unit 61 supplies power to the communication device 50 via wiring (not shown) and the DUT board 10.

The signal terminal testing unit 62 is for testing the DUT signal terminal and the signal terminal 51 of the communication device 50. The signal terminal testing unit 62 has a switch unit 62a, a driver 62b, a comparator 62c and a measurement unit 62d. The switch unit 62a has a switch for making and breaking the connection between the wire 11 and the driver 62b and comparator 62c, and a switch for making and breaking the connection between the wire 11 and the measurement unit 62d. The driver 62b, which is a circuit unit that outputs a drive signal (a logic signal) such as a test signal and clock signal when a test is conducted, is electrically connected to the switch unit 62a. The comparator 62c is a circuit unit which, when a test is conducted, responds to the drive signal by comparing an expected value with the results transmitted from the DUT or communication device 50. The measurement unit 62d is a unit for measuring a parameter such as the voltage of the DUT or communication device 50.

The signal terminal testing unit 63 is for testing the DUT signal terminal and the signal terminal 52 of the communication device 50. The signal terminal testing unit 63 has a switch unit 63a, a driver 63b, a comparator 63c and a measurement unit 63d. The switch unit 63a has a switch for making and breaking the connection between the wire 12 and the driver 63b and comparator 63c, and a switch for making and breaking the connection between the wire 12 and the measurement unit 63d. The driver 63b, which is a circuit unit that outputs a drive signal (a logic signal) such as a test signal and clock signal when a test is conducted, is electrically connected to the switch unit 63a. The comparator 63c is a circuit unit which, when a test is conducted, responds to the drive signal by comparing an expected value with the results transmitted from the DUT or communication device 50. The measurement unit 63d is a unit for measuring a parameter such as the voltage of the DUT or communication device 50.

A DUT is not illustrated. However, when a DUT has been inserted into the socket 20, the wires 13, 14 are not connected to the LSI tester 60 and measurement cannot be performed using the measurement function of the LSI tester 60. However, by inserting the shorting board 30 into the socket 20, the wire 13 is connected to the signal terminal testing unit 62 of the LSI tester 60 via the terminal 23 of the socket 20, the signal terminal 33, shorting wire 35 and signal terminal 31 of the shorting board 30, the terminal 21 of the socket 20, the wire 11 and the external wiring, and the wire 14 is connected to the signal terminal testing unit 63 of the LSI tester 60 via the terminal 24 of the socket 20, the signal terminal 34, shorting wire 36 and signal terminal 32 of the shorting board 30, the terminal 22 of the socket 20, the wire 12 and the external wiring. If at this time the number of signal lines between the DUT and LSI tester 60 is less than the number of signal wires or parts to be tested, preparing shorting boards 30 of various types will make it possible to connect all items under test to the LSI tester 60.

Figure 2:
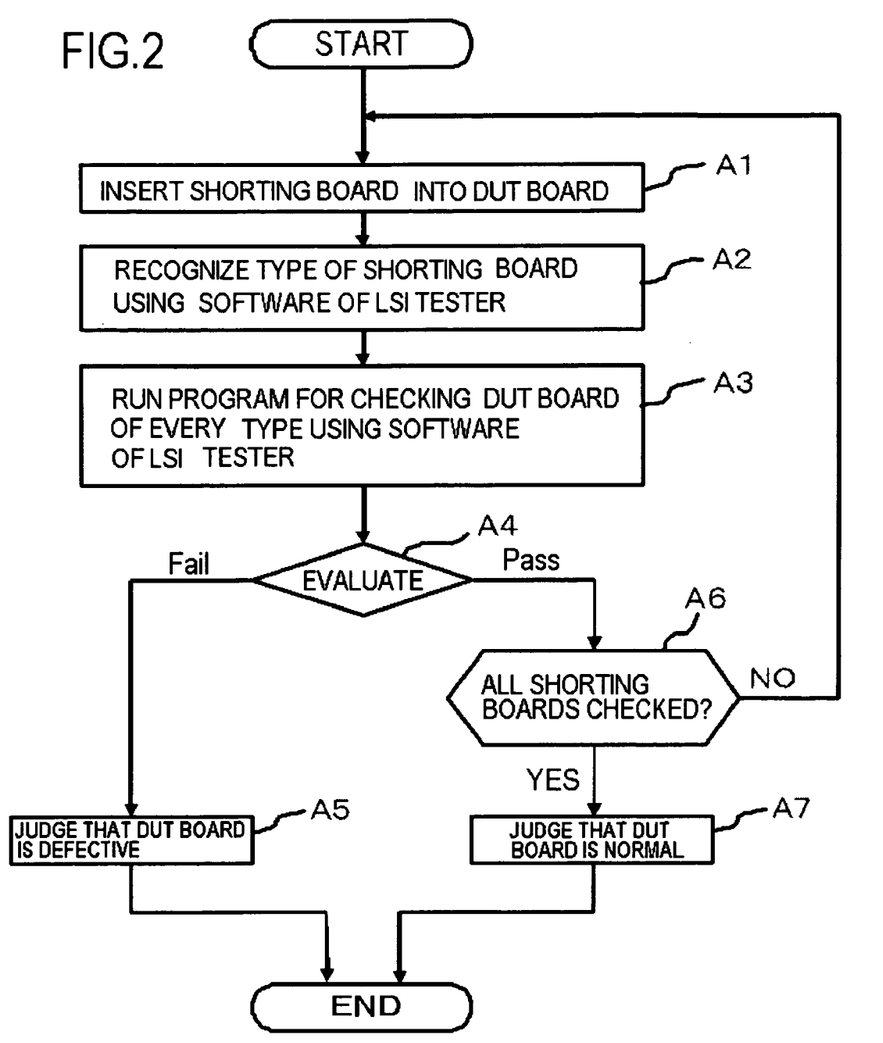
FIG. 2 is a flowchart illustrating operation of the circuit board test system according to the first exemplary embodiment.

Next, the operation of the circuit board test system according to the first exemplary embodiment of the invention will be described with reference to the drawings, in which FIG. 2 is a flowchart illustrating operation of the circuit board test system according to the first exemplary embodiment. Refer to FIG. 1 with regard to each of the components of the circuit board test system.

First, as shown in FIG. 1, with the communication device 50 inserted into socket 40 of the DUT board 10, the shorting board 30 is inserted into socket 20 (step A1). As a result, the wire 13 is connected to the signal terminal testing unit 62 of the LSI tester 60 via the terminal 23 of socket 20, the signal terminal 33, shorting wire 35 and signal terminal 31 of shorting board 30, the terminal 21 of socket 20, the wire 11 and the external wiring in such a manner that impedance and wiring length can be controlled. Further, the wire 14 is connected to the signal terminal testing unit 63 of the LSI tester 60 via the terminal 24 of socket 20, the signal terminal 34, shorting wire 36 and signal terminal 32 of shorting board 30, the terminal 22 of socket 20, the wire 12 and the external wiring in such a manner that impedance and wiring length can be controlled.

It should be noted that in a case where the LSI tester 60 has a plurality of signal terminal testing units (not shown), the electrical connections to the corresponding plurality of terminals of the communication device 50 are made in a manner similar to that of FIG. 1. Further, in a case where the number of connection signals between a DUT and the LSI tester 60 is smaller than the number of signal wires or parts to be tested, preparing shorting boards of various types will make it possible to connect all items under test to the LSI tester 60.

Next, the LSI tester 60 runs software (a test program) for discriminating the shorting board and the type (internal wiring) of the shorting board 30 is identified (step A2).

In a case where shorting boards 30 of a plurality of types exist, usually software for each individual shorting board is necessary and it is required to reload software or exercise control as by an external flag in conformity with the shorting board 30. However, in the first exemplary embodiment, the shorting board 30 per se is additionally provided with a function for automatically recognizing the board type, and this makes it possible to afford the software with a function for evaluating the shorting board and with a flow control function. This obviates the need for reloading of software and for control based upon an external flag and shortens the time needed to test the DUT board.

Next, in accordance with the type (internal wiring) of shorting board 30 identified at step A2, the LSI tester 60 runs the software (DUT board test program) that is to be executed (step A3). As a result of executing the DUT board test program, drive signals (logic signals) are input to the communication device 50 from the drivers 62b, 63b in the signal terminal testing units 62, 63, respectively, and the output signals of the communication device 50 are observed at the comparators 62c, 63c in the signal terminal testing units 62, 63, respectively, whereby the logical functions of the communication device 50 are checked. For example, the LSI tester 60 checks the functions of the communication device 50 used in checking the DUT, or checks connection/contact resistance between the socket 20 and the communication device 50, or checks the connections and measures the parameters of the part (terminating resistor or power-source filter) mounted on the board.

It should be noted that the specific electrical measurement method used when the DUT board test program is executed may be a known method implemented upon connecting a DUT to the LSI tester 60. For example, with regard to the signal terminal testing unit 62, a signal is applied from the measurement unit 62d at a constant current (e.g., 1 mA) and the voltage generated is measured. As a result, since the signal terminal testing unit 62 is electrically connected to the signal terminal 51 of communication device 50 via the external wiring, wire 11, the terminal 21 of socket 20, the signal terminal 31, shorting wire 35 and signal terminal 33 of the shorting board 30, the terminal 23 of socket 20, the wire 13 and the terminal 41 of socket 40, it is possible to measure the characteristics of protective diode elements, etc., inside the communication device 50. Similarly, with regard to the signal terminal testing unit 63, a signal is applied from the measurement unit 63d at a constant current (e.g., 1 mA) and the voltage generated is measured. As a result, since the signal terminal testing unit 63 is electrically connected to the signal terminal 52 of communication device 50 via the external wiring, wire 12, the terminal 22 of socket 20, the signal terminal 32, shorting wire 36 and signal terminal 34 of the shorting board 30, the terminal 24 of socket 20, the wire 14 and the terminal 42 of socket 40, it is possible to measure the characteristics of protective diode elements, etc., inside the communication device 50. Further, based upon the results of measurement by the signal terminal testing units 62, 63, the LSI tester 60 verifies the connections (open/shorted) and measures the contact and wiring resistance of the socket 20, wire 14, socket 40 and communication device 50.

Next, the LSI tester 60 compares the results of the various verifications and measurements performed at step A3 with previously set expected values and evaluates the results (step A4). It should be noted that rather than rendering the pass/fail decision at step A4, the LSI tester 60 may obtain a log of functions and a log of actual values of DC measurement by a log sampling function of the LSI tester 60.

If a value has departed from the expected value ("Fail" at step A4), then the LSI tester 60 judges that the shorting board 30 is defective (step A5). This processing is then exited.

If a value has not departed from the expected value ("Pass" at step A4), then the LSI tester 60 determines whether all of the shorting boards 30 have been used (step A6). If all of the shorting boards 30 have not been used ("NO" at step A6), control returns to step A1.

If all of the shorting boards 30 have been used ("YES" at step A6), the LSI tester 60 judges that the DUT board 10 is normal (step A7).

Figure 3A:
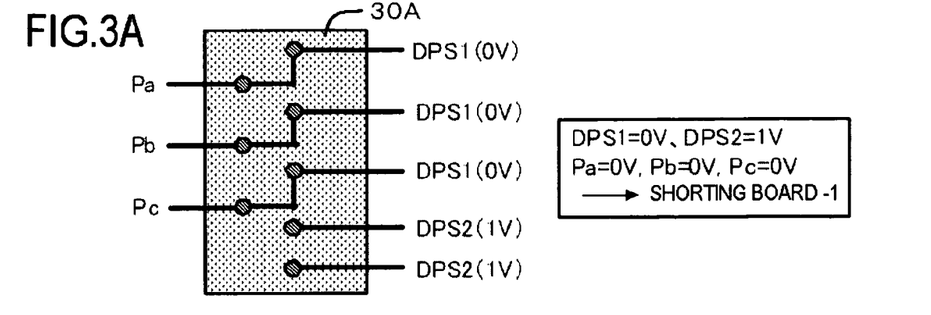
FIGS. 3A to 3C are schematic views useful in describing an operation for automatically identifying the type of a shorting board used in the circuit board test system according to the first exemplary embodiment.
Figure 3B:
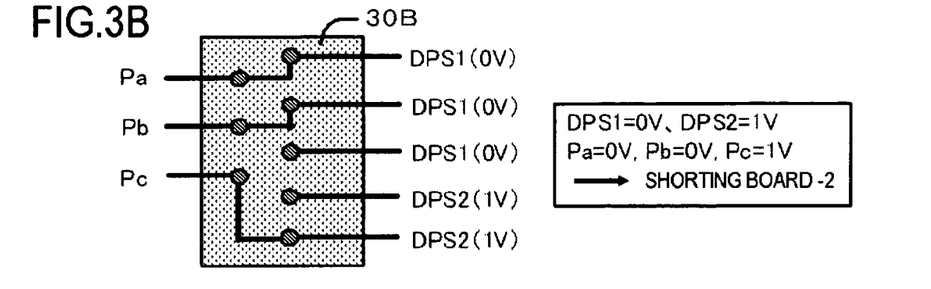
Figure 3C:
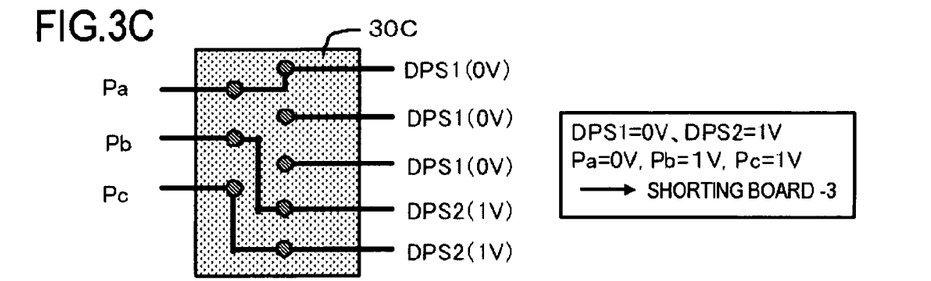

Next, the operation for automatically identifying the type of shorting board 30 at step A2 in FIG. 2 will be described with reference to the drawings. FIG. 3 is a schematic view useful in describing an operation for automatically identifying the type of a shorting board used in the circuit board test system according to the first exemplary embodiment.

By way of example, three types of shorting boards 30A, 30B and 30C on which short-circuit wires between signal terminals have been laid out as shown in FIG. 3 are prepared. Signal terminals Pa, Pb, Pc are connected to signal terminals (not shown) of the LSI tester 60 (see FIG. 1), and terminals DPS1, DPS2 are connected to power terminals (not shown) of the LSI tester 60 (FIG. 1). When the type of shorting board is identified, 0 V and 1 V, for example, are applied to DPS1 and DPS2, respectively, and the potentials at the signal terminals Pa, Pb, Pc are measured. As a result, whether the shorting board presently inserted is board 30A, 30B or 30C can be identified by the software of the LSI tester 60.

In the case of FIG. 3, the shorting board 30A is identified as shorting board-1 when Pa=0 V, Pb=0 V, Pc=0 V holds, as shorting board-2 when Pa=0 V, Pb=0 V, Pc=1 V holds, and as shorting board-3 when Pa=0 V, Pb=1 V, Pc=1 V holds.

In accordance with the first exemplary embodiment, verification of the logical operation, connections and parameters of the various parts mounted on the DUT board 10 can be performed at high speed using the measurement function of the LSI tester 60. Further, since the wires 13, 14 of the DUT board 10 not directly connected to the LSI tester 60 are capable of being connected to the LSI tester 60 by the shorting wires 35, 36 of the shorting board 30 in which impedance and wiring length are controllable, it is possible to check the functions of the communication device 50 used in the checking of the DUT, check the connection/contact resistance between socket 20, socket 40 and the communication device 50, check the connections of the part (terminating resistor or power-source filter) mounted on the board, and measure the parameters.

Further, in accordance with the first exemplary embodiment, it is unnecessary to add a verifying circuit or tester signal terminal onto the wires 13, 14 to be tested on the DUT board 10, no signal degradation at the time of a test operation is induced, characteristics are not adversely affected and there is no overhead in terms of the area of the DUT board 10.

Further, in accordance with the first exemplary embodiment, with regard to a portion where the resistance value fluctuates owing to the state of contact between the DUT and socket 20, measurement of the DUT board 10 is possible by reproducing the same state when the DUT is tested.

Furthermore, in accordance with the first exemplary embodiment, the fact that the shorting board 30 has been inserted and the type of shorting board can be specified by the program executed by the LSI tester 60. As a result, it is possible to check the DUT board 10 without re-loading the tester software even in a mass-production environment. This means that there is no decline in the throughput of mass production.

Further, the first exemplary embodiment is such that with the communication device 50 inserted into the socket 40, the communication device 50 can be checked as is in the inserted state. Further, the communication device 50 can be tested in the state of actual use without any effects from the contact resistance of a probe used with a hand-held tester. It is unnecessary to expend a signal terminal of the LSI tester 60 in order to conduct a board test. A board for testing a communication device is not necessary when the logic of the shorting board 30 is checked.

Second Exemplary Embodiment

Figure 4:
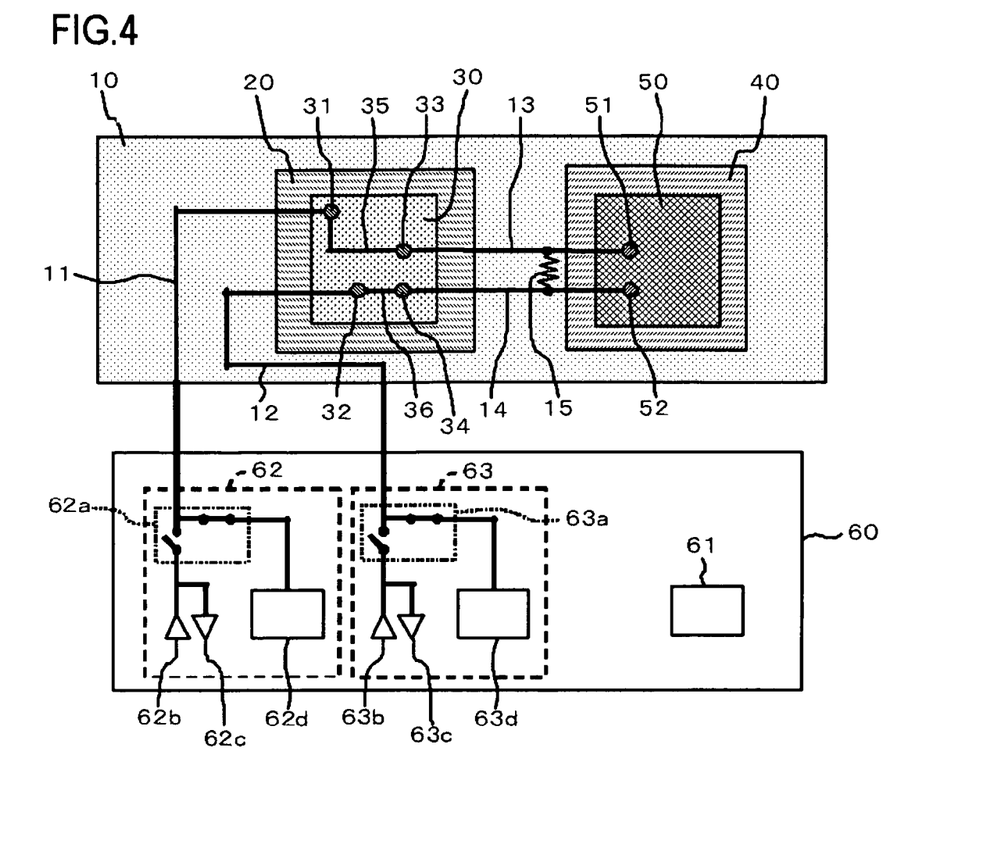
FIG. 4 is a schematic view illustrating the configuration of a circuit board test system according to a second exemplary embodiment of the present invention.

A circuit board test system according to a second exemplary embodiment of the present invention will now be described with reference to the drawings, in which FIG. 4 is a schematic view illustrating the configuration of a circuit board test system according to the second exemplary embodiment.

In the second exemplary embodiment, the DUT board 10 is so adapted that the characteristic of a terminating resistor 15 disposed between the wires 13 and 14 directly underlying the socket 40 is measured. The configuration of this exemplary embodiment is similar to that of the first exemplary embodiment in other respects.

By inserting the shorting board 30 into the socket 20 with the communication device 50 inserted into the socket 40 of the DUT board 10, as shown in FIG. 4, the wire 13 is connected to the signal terminal testing unit 62 of LSI tester 60 via the socket 20, shorting board 30, wire 11 and external wiring, and the wire 14 is connected to the signal terminal testing unit 63 of LSI tester 60 via the socket 20, shorting board 30, wire 12 and external wiring. By applying a constant voltage from the driver 62b of the signal terminal testing unit 62 and applying a constant current (e.g., 1 mA) from the measurement unit 63d of the signal terminal testing unit 63 and measuring the generated voltage under these conditions, it is possible to measure the characteristic of the terminating resistor 15 underlying the socket 40 via the wires 11, 12, socket 20, shorting board 30 and wires 13, 14.

In accordance with the second exemplary embodiment, by properly designing the shorting board 30, it is also possible to measure the characteristic of the terminating resistor 15 between two or more wires 13, 14 using the measurement function of the LSI tester 60.

Third Exemplary Embodiment

Figure 5:
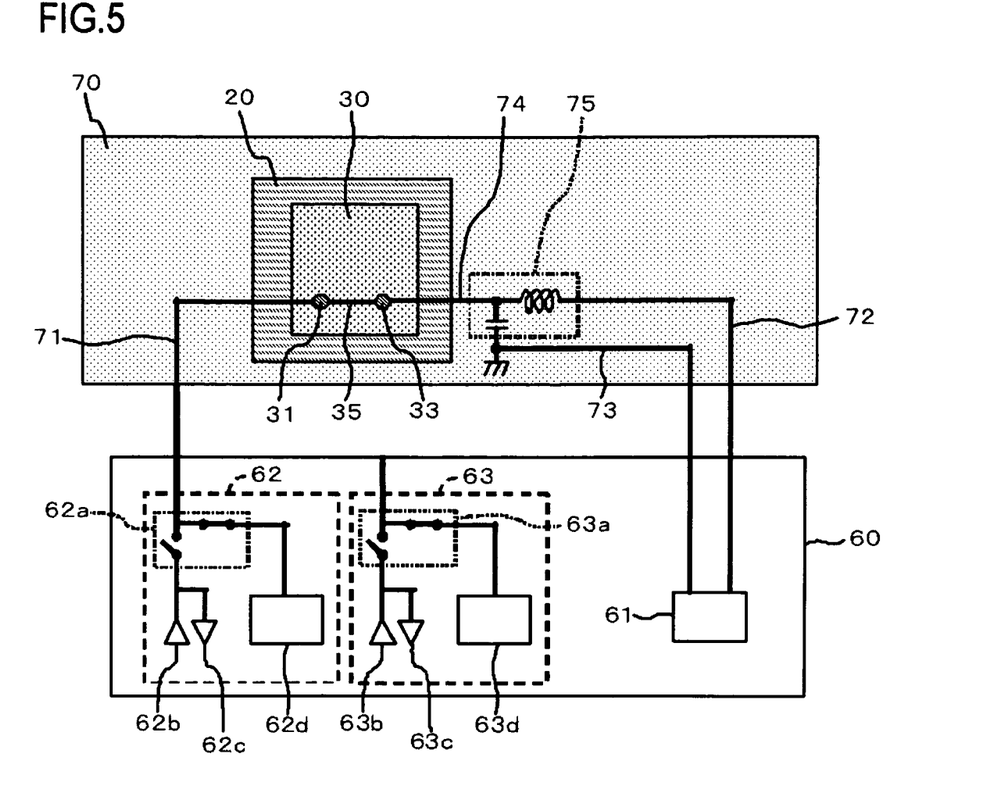
FIG. 5 is a schematic view illustrating the configuration of a circuit board test system according to a third exemplary embodiment of the present invention.

A circuit board test system according to a third exemplary embodiment of the present invention will now be described with reference to the drawings, in which FIG. 5 is a schematic view illustrating the configuration of a circuit board test system according to the third exemplary embodiment.

In the third exemplary embodiment, a DUT board 70 has a power-source filter 75 and is equipped with the socket 20 for removable insertion of the shorting board 30. The DUT board 70 has a wire 71 electrically connecting the signal terminal 31 of shorting board 30 and the signal terminal testing unit 62 of LSI tester 60; a wire 72 electrically connecting a coil of the power-source filter 75 and the device power-source unit 61 of LSI tester 60; a wire 73 electrically connecting a capacitor of the power-source filter 75 and the device power-source unit 61; and a wire 74 electrically connecting the signal terminal 33 of shorting board 30 with the coil and capacitor of the power-source filter 75. The signal terminals 31, 33 of shorting board 30 are electrically connected via the shorting wire 35 in the shorting board 30. The configuration of this exemplary embodiment is similar to that of the first exemplary embodiment in other respects.

By inserting the shorting board 30 into the socket 20, as shown in FIG. 5, the power-source filter 75 is connected to the signal terminal testing unit 62 of LSI tester 60 via the wire 74, socket 20, shorting board 30 and wire 71. Further, the power-source filter 75 is connected to the device power-source unit 61 of LSI tester 60 via the wires 72, 73. By applying a constant voltage from the device power-source unit 61 and applying a constant current (e.g., 1 mA) from the measurement unit 62d of the signal terminal testing unit 62 and measuring the generated voltage under these conditions, it is possible to measure the characteristic of the power-source filter 75 in the vicinity of the socket 20 of the DUT board 70 via the wire 71, socket 20 and shorting board 30.

Comparative Examples

Figure 6:
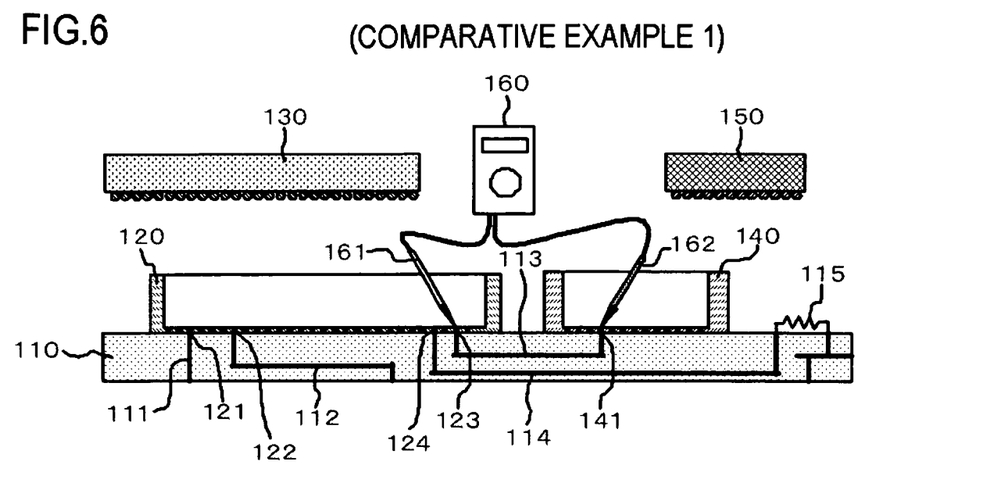
FIG. 6 is a schematic view illustrating a configuration of a circuit board test system according to a first comparative example for comparison purposes.
Figure 7:
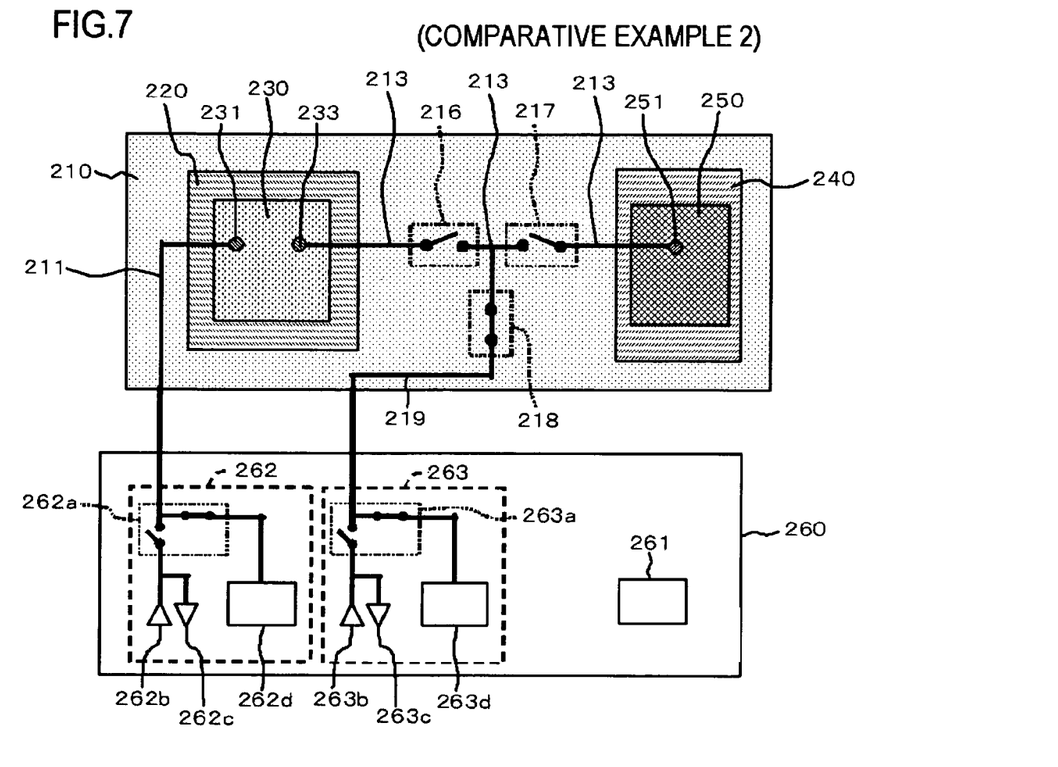
FIG. 7 is a schematic view illustrating a configuration of a circuit board test system according to a second comparative example for comparison purposes.

Next, reference will be had to the drawings to describe comparative examples relating to a check of the functions of a communication device used in the checking of a DUT, a check of the connection/contact resistance between a DUT socket and communication device, a check of the connections of the part (terminating resistor or power-source filter) mounted on a board, and measurement of the parameters. FIG. 6 is a schematic view illustrating the configuration of a circuit board test system according to a first comparative example for comparison purposes, and FIG. 7 is a schematic view illustrating the configuration of a circuit board test system according to a second comparative example for comparison purposes.

In a complicated DUT board on which various communication devices have been mounted as in the prior art, the wiring directly connected to the LSI tester is subjected to verification of connections and measurement of wiring resistance by inserting a DUT into the DUT board. However, wiring and parts not directly connected to the signal terminals of the LSI tester cannot be tested as is using the functions of the LSI tester. Conceivable examples of such circuit board test systems for testing wiring and parts are described below.

In order to check the connections and measure the wiring resistance of a wire 113 between a socket 120 for a DUT 130, which has not been connected to an LSI tester, and a socket 140 for a communication device 150, as illustrated in FIG. 6, the arrangement of the first comparative example is conceivable, in which the DUT 130 and communication device 150 are removed from the sockets 120 and 140, respectively, and resistance is measured using a hand-held tester 160, etc.

However, the four problems set forth below primarily arise in the case of the first comparative example.

The first problem is that there are cases where wires such as the wire 113 in the DUT board 110 may reach a number as high as 1000. The result is that testing takes an extremely long time.

The second problem is that with the communication device 150 mounted in the socket 140, measurement is impossible and this makes it impossible to verify contact between the communication device 150 and socket 140. Further, in a case where the communication device 150 has been mounted on the DUT board 110 directly by soldering without using the socket 140, whether mounting has been performed correctly or not cannot be confirmed.

A third problem is that the way in which probes 161, 162 of the hand-held tester 160 are brought into contact with terminals 122, 141 results in a state of contact that is very different from that in a case where the DUT 130 and communication device 150 are inserted into the sockets 120 and 140, respectively. As a consequence, the resistance values at the time of actual measurement cannot be exactly reproduced and measured.

A fourth problem is that the functions of the communication device cannot be checked.

Accordingly, a circuit board test system such as that of the second comparative example (see FIG. 7) is conceivable as a method of solving these problems. In order to verify the connections of a wire 213 between a terminal 233 of a DUT 230 and a terminal 251 of a communication device 250 in the second comparative example, relays 216, 217 are inserted in the wire 213. The wire 213 between the relays 216, 217 is connected to a signal terminal testing unit 263 of an LSI tester 260 via a relay 218. By inserting the DUT 230 and communication device 250 into sockets 220 and 240, respectively, a terminal 233 of the DUT 230 and a measurement unit 263d of the LSI tester 260 are connected via the wire 213, relay 216, wire 213, relay 218, a wire 219 and a switch unit 263a. At this time the relay 217 disconnects the communication device 250 from the wire 219. By measuring the diode characteristic of the signal terminal 233 of DUT 230 using the measurement unit 263d under these conditions, the connection between the wire 213 and DUT 230 is checked and the wiring resistance is measured. Next, the relays 217, 218 connect the communication device 250 and the measurement unit 263d of LSI tester 260 via the wire 219. At this time the relay 216 disconnects the DUT 230 from the wire 219. By measuring the diode characteristic of the signal terminal 251 of communication device 250 using the measurement unit 263d under these conditions, the connection between the wire 213 and DUT 230 is checked and the wiring resistance is measured. Further, in a case where there are a plurality of wires connecting the communication device 250 and LSI tester 260, the wire 219 is connected with a driver 263b and comparator 263c of LSI tester 260 via the switch unit 263a and therefore the operation of the communication device 250 is checked using the logical operation verification function of the LSI tester 260. In a case where the DUT 230 and communication device 250 are made to communicate and the DUT 230 is checked, the relays 216, 217 are closed and the relay 218 is opened. The first to fourth problems of the first comparative example are solved by this method.

With the second comparative example (see FIG. 7), however, the three problems mentioned below arise separately.

The first problem is that with regard to the wire 213, the wire to the relay 213 forms a stub. If a high-speed signal is transmitted, this causes waveform distortion and influences the inspection of the DUT 230.

The second problem is that it is necessary to place the relays 216, 217 in the wire 213. This makes design more difficult in a case where if there is no leeway with regard to wiring space.

The third problem is that the signal terminal testing unit 263 of LSI tester 260 is required in order to test the wire 213. In FIG. 7, however, this does not apply if it can be so designed that the wires 211 and 219 are connected by a relay.

The program according to the third aspect may be implemented as a computer readable program which may be executed by the tester, and may be stored in a recording medium contained in a tester, or may be disposed remote from the tester itself and can be brought in the communication/connection with the tester through a communication line or wire, including a wireless communication.

Typically, the program can execute the method aforementioned particularly every step (or processing) thereof. Alternatively, the program may be formulated so as to execute/operate the circuit board test system disclosed herein.

Thus the invention as illustrated by the first to third exemplary embodiments has been devised in order to solve the problems that arise with the first and second comparative examples.

As many apparently widely different exemplary embodiments of the present invention can be made without departing from the spirit and scope thereof, it is to be understood that the invention is not limited to the specific exemplary embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A circuit board test system for testing a circuit board used in a case where a device under test is tested using a tester, said circuit board test system comprising:
    said circuit board that can selectively be tested by said circuit board test system, wherein said circuit board comprises:
        a socket into which a device under test is removably inserted;
        one or a plurality of communication devices mounted thereon directly or indirectly;
        a plurality of first wires electrically connecting first signal terminals of the device under test and the tester; and
        a plurality of second wires electrically connecting second signal terminals of the device under test, if such device under test is inserted in said socket, said plurality of second wires not being electrically connected to the first signal terminals, and signal terminals of at least one of the communication devices; and
    a shorting board being inserted into the socket in place of the device under test when said circuit board is tested, said shorting board comprising short-circuit wires electrically connecting selected ones of the first wires and the second wires.

2. The system according to claim 1, wherein said circuit board further comprises a terminating resistor between selected ones of the second wires.

3. The system according to claim 1, wherein a power-source filter is mounted on said circuit board, and said circuit board further comprises:
    a third wire electrically connecting a third signal terminal of the device under test and the tester;
    a fourth wire electrically connecting the power-source filter and the tester; and
    a fifth wire electrically connecting a fourth signal terminal of the device under test that is not electrically connected to the third signal terminal, and the power-source filter,
    wherein said system further comprises a second shorting board being inserted into the socket in place of the device under test when said circuit board is tested, said second shorting board comprising a short-circuit wire electrically connecting the third wire and the fifth wire.

4. The system according to claim 2, wherein a power-source filter is mounted on said circuit board, and said circuit board further comprises:
    a third wire electrically connecting a third signal terminal of the device under test and the tester;
    a fourth wire electrically connecting the power-source filter and the tester; and
    a fifth wire electrically connecting a fourth signal terminal of the device under test that is not electrically connected to the third signal terminal, and the power-source filter,
    wherein said system further comprises a second shorting board being inserted into the socket in place of the device under test when said circuit board is tested, said second shorting board comprising a short-circuit wire electrically connecting the third wire and the fifth wire.

5. The system of claim 1, wherein said socket into which a device under test is removably inserted comprises a first socket mounted on said circuit board that can selectively be tested, said circuit board further comprising a second socket mounted on said circuit for removably inserting at least one of said at least one communication devices.

6. The system of claim 1, wherein said at least one communication device comprises at least one of a CPU (central processing unit) and a memory.

7. The system of claim 1, wherein said tester can selectively test any of:
the device under test, when inserted into said socket;
the one or plurality of communication devices mounted on said circuit board; and
said circuit board, when said shorting board is inserted into said socket.

8. The system of claim 7, wherein said tester tests said circuit board by one or more of:
checking connections between said socket and said one or plurality of communication devices;
checking connections of parts mounted on said circuit board; and
measuring predetermined parameters of said circuit board, including parameters of one or more components mounted on said board.

9. The system of claim 8, wherein said one or more components comprises at least one of:
a terminating resistor interconnected between two of said second wires; and
a power source filter.

10. The system of claim 1, wherein said shorting board comprises a feature for said tester to automatically recognize a type of shorting board currently inserted in said socket.

11. The system of claim 10, wherein said tester recognizes the type of shorting board which has been inserted into the circuit board and checks an electrical connection between the circuit board and a communication device mounted on the circuit board, or a function of the communication device, in accordance with the type of shorting board recognized.

12. The system of claim 1, wherein said device under test is tested by causing at least one of the communication devices to communicate with the device under test during the test.

* * * * *